United States Patent [19]

Avellino et al.

[11] 4,412,798

[45] Nov. 1, 1983

[54] MOLD CLEAR DETECTOR

[75] Inventors: Frank J. Avellino, Russell; John E. Hoffman, Warren, both of Pa.

[73] Assignee: GTE Products Corporation, Stamford, Conn.

[21] Appl. No.: 319,773

[22] Filed: Nov. 9, 1981

[51] Int. Cl.³ .......................... B29C 1/00; B29C 11/00
[52] U.S. Cl. .................................... 425/137; 164/154; 250/222.1; 250/222.2; 250/561; 425/154
[58] Field of Search ...................... 425/136, 137, 154; 90/13 C; 250/222.1, 222.2, 561; 164/150, 154, 155, 456

[56] References Cited

U.S. PATENT DOCUMENTS

| | | | |
|---|---|---|---|
| 3,105,907 | 10/1963 | Colten et al. | 90/13 C X |
| 3,117,348 | 1/1964 | Rees | 425/154 |
| 3,303,537 | 2/1967 | Mislan | 425/137 X |
| 3,525,382 | 8/1970 | Devol | 425/137 X |
| 3,642,401 | 2/1972 | Wilson | 425/137 |
| 3,836,299 | 9/1974 | Houston et al. | 425/136 X |

*Primary Examiner*—Willard E. Hoag
*Attorney, Agent, or Firm*—John A. Odozynski

[57] ABSTRACT

An apparatus for detecting the retention of non-ejected parts in the cavity of a plastic molding machine and inhibiting the operation of the molding machine in response thereto. The apparatus employs a set of photocells coupled via associated fiber optic cables to a comparator. The retention of a molded part subsequent to the completion of a molding cycle is indicated by the interruption of a light beam generated by at least one of the photocells. The optical signal is processed by the comparator and associated circuitry so as to activate a mold inhibiting relay.

3 Claims, 1 Drawing Figure

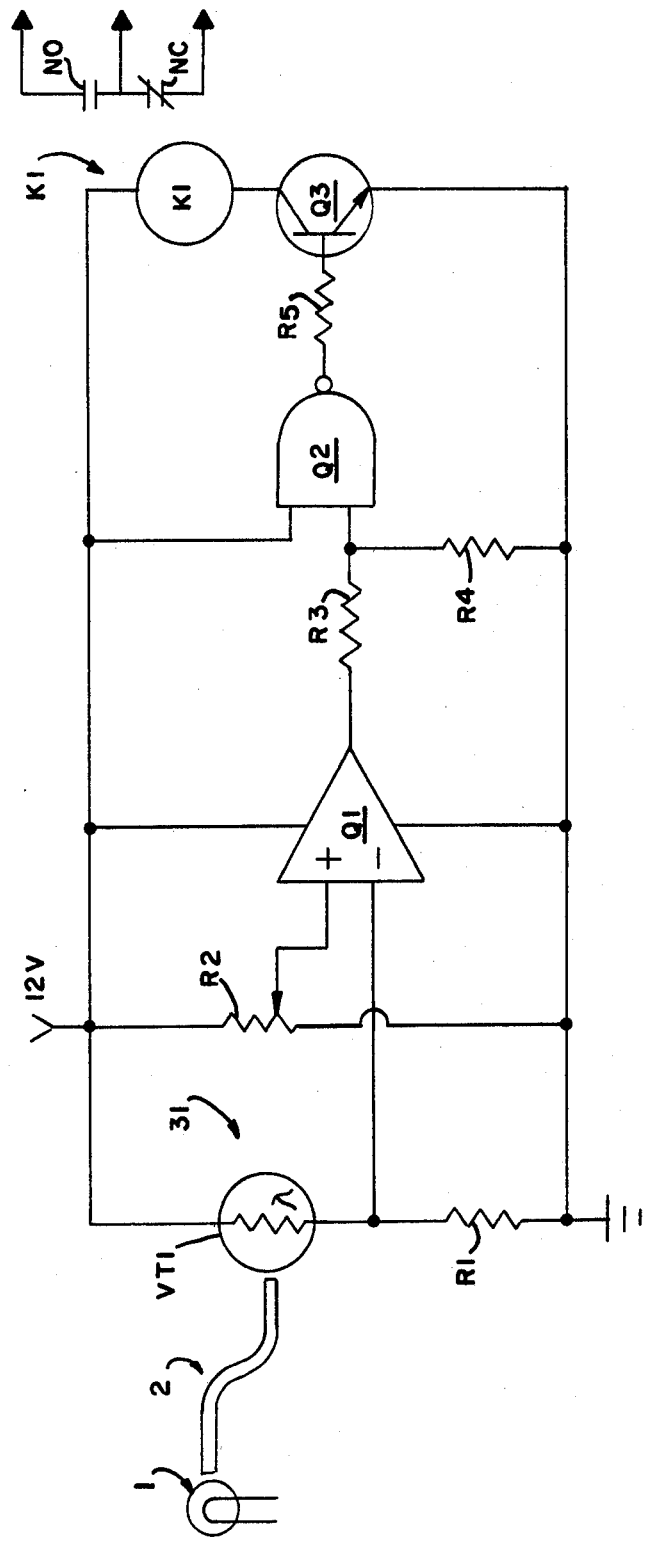

MOLD CLEAR DETECTOR

TECHNICAL FIELD

This invention relates to the the molding of plastic parts and more particularly to an apparatus for detecting the retention of parts in the cavity of a molding machine upon completion of the molding cycle and for inhibiting the molding operation in response thereto.

BACKGROUND OF THE INVENTION

One of the problems encountered in the fabrication of plastic parts, or parts fabricated from other similarly suitable materials, in a compression molding process is the periodic failure of parts to be successfully ejected from the mold cavity upon completion of the mold machine cycle. Clearly, retention of molded parts in the cavity will result in subsequent unsatisfactorally molded parts.

In the past this problem has been addressed simply by having an operator monitor the molding process and turn the mold press off upon observation of a non-ejected part. However, because an operator could be expected on occasion to fail to observe non-ejected part and because, in any event, this approach introduced undesirable delay and attendant expense into the molding process, an improved solution was sought.

Some limitations inherent in the operator-monitor approach can be circumvented by the installation of a miniature lamp in the mold machine. In a manner roughly analogous to the one described below, the lamps can be used to detect the retention of a molded part in the mold cavity and to appropriately modify the operation of the mold machine. However, initial installation of miniature lamps has proved costly and the expense of installation is exacerbated by the relatively short lamp life resulting from the hostile environment, that is, heat and vibration, presented by the molding process.

DISCLOSURE OF THE INVENTION

The above and other objects and advantages are achieved in one aspect of this invention by a mold clear detector that comprises a light generating element, for example, a photocell, in the mold cavity. The photocell develops an optical signal indicating the retention or ejection of a part from the mold cavity upon completion of a mold machine cycle. An optical transmission path in the form of a fiber optic cable couples the optical signal to a light-sensitive element. The light-sensitive element represents a part of a control device that inhibits the operation of the mold machine as a result of the non-ejection of a part from the mold cavity. The device also includes a comparator that has an input coupled to the light-sensitive element and that is, therefor, responsive to the optical signal developed by the photocell. A switching circuit driven by the comparator is adapted to inhibit the mold machine when necessary.

BRIEF DESCRIPTION OF THE DRAWING

The sole drawing is a schematic diagram of the subject mold clear detector.

BEST MODE FOR CARRYING OUT THE INVENTION

For a better understanding of the present invention, together with the objects, advantages and capabilities thereof, reference is made to the following disclosure and appended claims in conjunction with the above description of some of the aspects of the invention.

Referring now to the drawing, the subject mold clear detector comprises a light-generating element in the form of a photocell 1. The photocell is suitably positioned in the mold cavity (not shown) so that a beam of light is normally focused on the cell but is broken when a molded part is retained, that is, not ejected from the mold cavity upon completion of the mold machine cycle. In this fashion the photocell can be viewed as generating an optical signal dependent on the ejection or retention of molded parts in the mold cavity.

The optical signal is coupled from the photocell via an optical transmission path in the form of a fiber optic cable 2 to the input of control means 3. In a manner more fully disclosed below, control means 3 operates to selectively inhibit the operation of the molding machine as the result of the retention of a molded part in the mold cavity.

Control means 3 comprises a voltage divider 31 coupled between a first reference potential, +12 V, and a second reference potential, ground. The voltage divider includes a light-sensitive element in the form of a light-dependent resistor, VT1, coupled between the +12 V supply and an inverting (signal) input of a comparator Q1, and a fixed resistor R1 coupled between the signal input of Q1 and ground. A variable resistor R2 is coupled between the +12 V supply and ground and has a wiper coupled to the non-inverting (reference) input of comparator Q1. For this reason the voltage divider 31 and variable resistor R2 can be considered the signal and reference sources, respectively, for Q1.

The output of Q1 is coupled to the input of a switching circuit 32 including a logic element in the form of a NAND gate Q2, a transistor Q3, and a mold inhibiting device, relay means K1. In particular, the output of Q1 is coupled through a resistor R3 to an input of Q2 which is, in turn, coupled through a resistor R4 to ground. The output of Q2 is coupled through a resistor R5 to an input electrode, the base, of Q3. Q3 has an emitter connected to ground and an output electrode, collector, coupled to one end of the coil of R1. The other end of that relay coil is coupled to the +12 V supply. The normally open (NO) and normally closed (NC) contacts of K1 are adapted to be coupled to the mold machine (not shown). The mold machine, per se, is considered to be no part of this invention.

During normal operation of the molding system, the mold machine successfully ejects mold parts upon completion of the machine cycle. Light impinging on the photocell will remain uninterrupted and will be transmitted by the fiber optic cable to the control means at VT1. Because, according to the commonly understood operation of light-dependent resistors, the effective resistive value of VT1 will be lower when VT1 is illumninated than when it is in a dark environment, the voltage at the inverting input of Q1 will be less than the voltage at its non-inverting input. Consequently the voltage at the output of Q1 will be high, a logic level ONE, and the voltage at the output of Q2 will be low, a logic level ZERO. (It is clear that in the configuration shown in the drawing Q2 is functionally equivalent to an inverter and its operation may be understood as such.) Transistor Q3 will be non-conducting and no current will flow through the coil K1, thereby allowing the molding machine to proceed to the next machine cycle.

However should a molded part fail to be ejected at the end of a machine cycle, the beam of light impinging on the photocell will be interrupted. The interruption of light will cause the effective resistive value of VT1 to increase and the voltage at the inverting input of Q1 to decrease concomitantly. The resulting logic level ZERO at the output of Q1 will be translated to a logic level ONE at the output of the NAND gate. Q3 will be rendered conductive, thereby "pulling in" K1 so that its contacts will be in a state opposite to that shown in the drawing. The contacts of K1 are wired to the molding machine so that its operation will be inhibited pending the removal of the part from the mold cavity.

It should be noted that, although the subject invention has been at least implicitly described with reference and relation to compression molding of plastic parts, other types of molding techniques and materials and, for that matter, other machine operations are clearly within the contemplation of the invention as set forth above and claimed below. Furthermore it is an obvious expedient to extend the apparatus as in described above and shown in the drawing to a plurality of mold cavities. Accordingly, while there has been shown and described what at present is considered to be the preferred embodiment of a mold clear detector, it will be obvious to those skilled in the art that various modifications may be made therein without departing from the invention as defined by the appended claims.

INDUSTRIAL APPLICABILITY

This invention is useful in the automatic monitoring of various machine operations and, in particular, fabrication of molded parts.

What is claimed is:

1. In a mold machine system for fabricating plastic parts or parts from other suitable materials, a mold clear detector sensitive to the extraction or retention of parts from the mold cavity for inhibiting the operation of the mold machine as a result of the retention of parts upon completion of the mold machine cycle, said detector comprising:
    a photocell adapted to be positioned in the mold so as to develop an optical signal in accordance with the retention or extraction of a part from the mold cavity upon completion of the mold machine cycle;
    a light-dependent resistor;
    a fiber optic cable coupling the photocell to the light-dependent resistor;
    a comparator having an input coupled to the light-dependent resistor, said comparator responsive to the optical signal developed by the photocell; and
    a switching circuit having an input coupled to an output of the comparator and an output adapted to be coupled to the mold machine, said circuit for inhibiting the operation of the mold machine as a result of the retention of parts upon completion of the mold machine cycle.

2. A mold clear detector as defined in claim 1 wherein the switching circuit comprises:
    a logic element having an input coupled to an output of the comparator,
    a transistor having an input coupled to an output of the logic element and relay means having an input coupled to an output of the transistor and having an output adapted to be coupled to the mold machine.

3. A mold clear detector as defined in claim 2 wherein the logic element is an inverter and the transistor has a base electrode coupled to the output of the inverter, a collecter electrode coupled to the relay means, and an emitter electrode coupled to a reference potential.

* * * * *